US006830870B2

(12) United States Patent
Malik et al.

(10) Patent No.: US 6,830,870 B2
(45) Date of Patent: Dec. 14, 2004

(54) ACETAL PROTECTED POLYMERS AND PHOTORESISTS COMPOSITIONS THEREOF

(75) Inventors: Sanjay Malik, Attleboro, MA (US); Stephanie J. Dilocker, East Providence, RI (US); Binod B. De, Providence, RI (US)

(73) Assignee: Arch Speciality Chemicals, Inc., Norwalk, CT (US)

( * ) Notice: Subject to any disclaimer, the term of this patent is extended or adjusted under 35 U.S.C. 154(b) by 6 days.

(21) Appl. No.: 10/446,540

(22) Filed: May 28, 2003

(65) Prior Publication Data

US 2004/0034160 A1 Feb. 19, 2004

Related U.S. Application Data

(60) Provisional application No. 60/383,535, filed on May 28, 2002.

(51) Int. Cl.[7] .............................. G03F 7/004; C08F 2/54
(52) U.S. Cl. ..................... 430/270.1; 430/320; 430/322; 430/329; 430/905; 430/910; 524/588; 524/593; 427/496
(58) Field of Search .............................. 430/270.1, 905, 430/910, 320, 322, 329, 9, 14; 524/588, 593; 427/496

(56) References Cited

U.S. PATENT DOCUMENTS

| | | | |
|---|---|---|---|
| 5,891,603 A | 4/1999 | Kodama et al. | 430/270.1 |
| 6,159,653 A | 12/2000 | Malik et al. | 430/270.1 |
| 6,207,343 B1 | 3/2001 | Fujimori et al. | 430/270.1 |
| 6,380,317 B1 | 4/2002 | Malik et al. | 525/266 |
| 2003/0065101 A1 | 4/2003 | Blakeney et al. | 525/288 |
| 2003/0134225 A1 | 7/2003 | Fujimori et al. | 430/270.1 |

FOREIGN PATENT DOCUMENTS

| | | |
|---|---|---|
| WO | WO 00/67072 | 9/2000 |
| WO | WO 01/86352 A3 | 11/2001 |
| WO | WO 02/033489 A3 | 4/2002 |

OTHER PUBLICATIONS

Brodsky et al., "*157 nm resist material: Progress Report*", J. Vac. Sci. Technol., B 18 (6), Nov./Dec. 2000, pp. 3396–3401.
Patterson et al., "*Polymers for 157 nm Photoresist Applications: A Progress Report*", Proceedings of SPIE vol. 3999, (2000), pp. 365–374.
Chiba et al., "*157 nm Resist Material : A Progress Report*", Journal of Photopolymer Science and Technology, vol. 13, No. 4 (2000), pp. 657–664.
Tran et al., "*Fluoropolymer Resist Materials for 157nm Microlithography*", Journal of Phtopolymer Science and Technology, vol. 14, No. 4 (2000), pp. 669–674.
International Search Report dated Nov. 28, 2003.

Primary Examiner—Yvette C. Thornton
(74) Attorney, Agent, or Firm—Ohlandt, Greeley, Ruggiero & Perle

(57) ABSTRACT

A polymer comprises an acetal-containing monomer unit having the general structure I and at least one of the fluorine-containing monomer units having the general structures II and III:

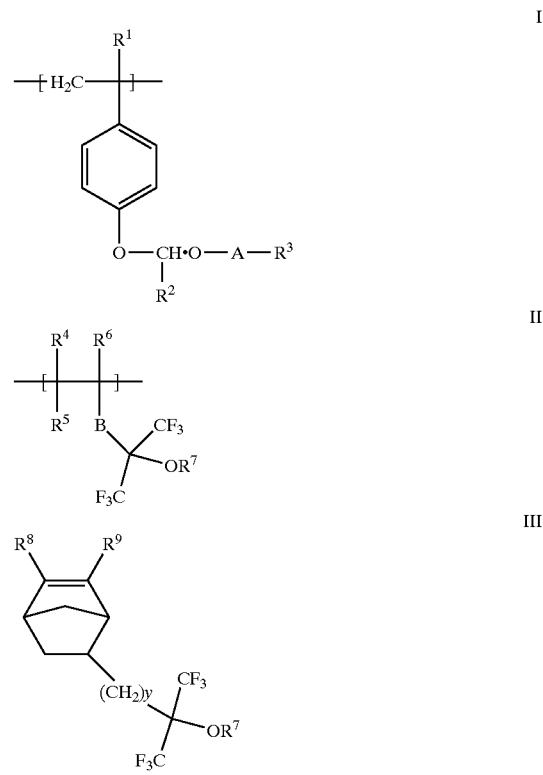

wherein $R^1$, $R^4$, $R^5$ and $R^6$ are each independently H, lower alkyl, $CH_2CO_2R^{10}$, cyano, $CH_2CN$, or halogen, wherein $R^{10}$ is any alkyl, cycloalkyl, aryl, arylalkyl, alkylenecycloalkyl, silyl or siloxy or linear or cyclic polysiloxane group; $R^2$ is $CHR^{11}R^{12}$ where $R^{11}$ and $R^{12}$ are each independently H, lower alkyl, cycloalkyl or aryl; A is a substituted or unsubstituted alkylene, cycloalkylene, alkylenecycloalkylene, or alkylenearylene; and $R^3$ is linear, branched or cyclic fluoroalkyl group or $SiR^{13}R^{14}R^{15}$ where $R^{13}$, $R^{14}$, and $R^{15}$ are each independently alkyl, cycloalkyl, aryl, arylalkyl, alkylenecycloalkyl, silyl, siloxy, linear or cyclic polysiloxane or silsesquioxane alkyl group; B is an aryl, C(=O)—O—$(CH_2)_x$ where $x=0–4$, lower alkyl, cycloalkyl, alkene cycloalkyl, silyl, siloxyl, or linear or cyclic polysiloxane group. $R^7$ is H or an acid sensitive group; $R^8$ and $R^9$ are each independently H or —CN group; and $y=0–4$ and the use of these polymers in radiation sensitive compositions for exposure to actinic radiation, especially radiation of 157 nm.

42 Claims, No Drawings

ACETAL PROTECTED POLYMERS AND PHOTORESISTS COMPOSITIONS THEREOF

RELATED APPLICATION

This application claims priority under 35 U.S.C. 119 from U.S. Provisional Application No. 60/383,535, filed May 28, 2002.

FIELD OF THE INVENTION

This invention relates to acetal-protected polymers and photoresist compositions thereof especially useful in 157-nm lithography.

BACKGROUND TO THE INVENTION

The wavelength of light for lithography has moved to 157-nm to produce the feature size necessary for future electronic devices. Production worthiness of a given resist platform is determined by two important factors: optical transparency and resistance to reactive ion-etching. As in the past, when the wavelength of light required to print is reduced, major modifications in material platform design have to be made at the new wavelength in order to optimize between these two factors. For instance, all phenolic polymers (novolaks and hydroxystyrenes) suitable at g-line, i-line, and 248-nm showed reasonable optical and etching characteristics; however, these materials are highly absorbing at 193-nm. Although aliphatic groups are transparent, they do not have sufficient etch resistance forcing use of alicyclic moieties to improve etch resistance.

At 157-nm, the same barrier to printing features exists in that only a few fluorine and silicon based compounds are transparent. Necessary structural modifications required to produce chemically amplified, resists out of these compounds invariably add to absorbance at 157-nm. Silicon-based resists may have sufficient etch resistance under $O_2$ plasma conditions when used in a bilayer resist design. Fluorine-based resists would require a relatively thick film in order to sustain plasma etch conditions and such film thicknesses may have unacceptably high optical density. Hence, the challenge is to design resist materials, which meet these two conditions. The objective of this present invention is to provide novel polymers based on fluorine and acetal-containing monomer units and their use in photoresist compositions for printing small features at 157-nm.

SUMMARY OF THE INVENTION

The invention provides a polymer comprising a fluorine-containing monomer unit, thereby providing a photoresist composition for 157-nm lithography.

The novel polymer comprises at least one acetal-containing monomer unit having the general structure I and at least one of the fluorine-containing monomer units having the general structures II and III:

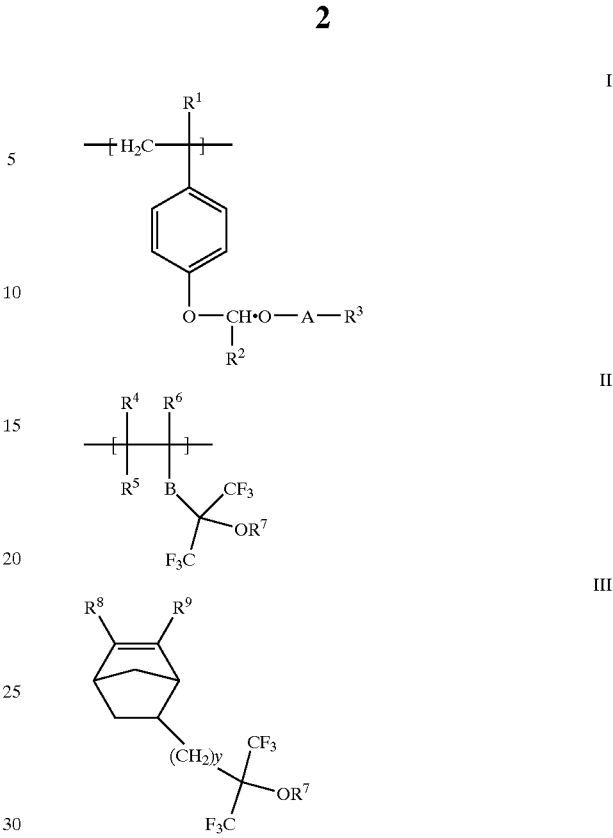

wherein $R^1$, $R^4$, $R^5$ and $R^6$ are each independently H, lower alkyl, $CH_2CO_2R^{10}$, cyano, $CH_2CN$, or halogen, wherein $R^{10}$ is any alkyl, cycloalkyl, aryl, arylalkyl, alkylenecycloalkyl, silyl or siloxy or linear or cyclic polysiloxane group; $R^2$ is $CHR^{11}R^{12}$ where $R^{11}$ and $R^{12}$ are each independently H, lower alkyl, cycloalkyl or aryl; A is a substituted or unsubstituted alkylene, cycloalkylene, alkylenecycloalkylene, or alkylenearylene; and $R^3$ is linear, branched or cyclic fluoroalkyl group or $SiR^{13}R^{14}R^{15}$ where $R^{13}$, $R^{14}$, and $R^{15}$ are each independently an alkyl, cycloalkyl, aryl, arylalkyl, alkylenecycloalkyl, silyl, siloxy, linear or cyclic polysiloxane or silsesquioxane alkyl group; B is an aryl, C(=O)—O—$(CH_2)_x$ where x=0–4, lower alkyl, cycloalkyl, alkene cycloalkyl, silyl, siloxyl, or linear or cyclic polysiloxane group. $R^7$ is H or an acid sensitive group; $R^8$ and $R^9$ are each independently a H or —CN group; and y=0–4.

The present invention also includes a photoresist composition comprising the novel polymer comprising at least one fluorine-containing monomer of Structure II or III or and at least one acetal-containing monomer of Structure I at least one photoacid generator compound, and at least one solvent.

The present invention also includes a silicon-containing resist comprising: a photoresist composition comprising at least one fluorine-containing monomer unit of Structures II or III and at least one acetal-containing monomer unit of Structure I wherein at least one of I, II, and III have a silicon substituent; provided that the silicon substituent is not directly attached to the acetal functionality; at least one photoacid generator compound, and at least one solvent.

The present invention also includes a bilayer resist comprising: a photoresist composition comprising at least one fluorine-containing monomer unit of Structures II or III and at least one acetal-containing monomer unit of Structure I at least one of which has a silicon substituent; provided that the silicon substituent is not directly attached to the acetal functionality, at least one photoacid generator compound, and at least one solvent; and an undercoat layer.

DETAILED DESCRIPTION OF THE INVENTION

The novel polymer comprises an acetal-containing monomer unit having the general structure I and at least one of the fluorine-containing monomer unit having the general structures II and III:

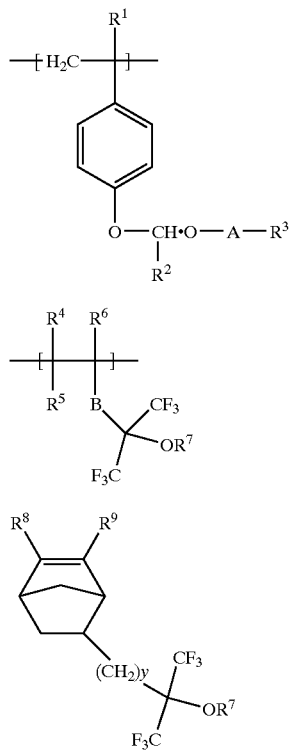

wherein $R^1$, $R^4$, $R^5$ and $R^6$ are each independently H, lower alkyl, $CH_2CO_2R^{10}$, cyano, $CH_2CN$, or halogen, wherein $R^{10}$ is any alkyl, cycloalkyl, aryl, arylalkyl, alkylenecycloalkyl, silyl or siloxy or linear or cyclic polysiloxane group; $R^2$ is $CHR^{11}R^{12}$ where $R^{11}$ and $R^{12}$ are each independently H, lower alkyl, cycloalkyl or aryl; A is a substituted or unsubstituted alkylene, cycloalkylene, alkylene-cycloalkylene, or alkylenearylene group; and $R^3$ is linear, branched or cyclic fluoroalkyl group or $SiR^{13}R^{14}R^{15}$ where $R^{13}$, $R^{14}$, and $R^{15}$ are independently alkyl, cycloalkyl, aryl, arylalkyl, alkylenecycloalkyl, silyl, siloxy, linear or cyclic polysiloxane or silsesquioxane alkyl group; B is aryl, C(=O)—O—$(CH_2)_x$ (x=0–4), lower alkyl, cycloalkyl, alkene cycloalkyl, silyl, siloxyl or linear or cyclic polysiloxane group; $R^7$ is H or an acid sensitive group; and $R^8$ and $R^9$ are H or —CN group; and y=0–4.

A is preferably selected from the group consisting of: methylene, ethylene, $CH_2C(CH_3)H$, propylene, $CH(CH_3)CH(CH_3)$, cyclohexylene, ethylenecyclohexylene, phenyleneethylene, and the like. $R^3$ is preferably selected from the group consisting of: tetrafluoroethyl, tridecafluorohexyl, perfluorocyclohexyl, perfluorophenyl, perfluoroethyl, perfluorobutyl, perfluorooctyl, trimethylsilyl, triethylsilyl, triphenylsilyl, tricyclohexylsilyl, tris(trimethylsiloxy)silyl, tris(trimethylsilyl)silyl, methylbis(trimethylsilyl)silyl, methylbis(trimethylsiloxy)silyl, dimethyl(trimethylsilyl)silyl, dimethyl(trimethylsiloxy) silyl, and cyclic or linear polysiloxane oligomer or polymer or a silsesquioxane alkyl group.

The acetal-containing monomer unit is typically generated by radical polymerization of a substituted styrene monomer, followed by reaction of the substituent to yield a hydroxystyrene monomer unit and subsequent reaction of the hydroxystyrene units with a vinyl ether of the structure:

where A, $R^3$, $R^{11}$, and $R^{12}$ are as defined as before. Typically, acetoxystyrene is polymerized and de-esterified to yield hydroxystyrene monomer units for reaction with the vinyl ether.

Alternatively, the monomer unit can be generated by reaction of the above generated hydroxystyrene monomer units with a vinyl ether and an alcohol of structure:

A is as defined before. Many vinyl ethers can be used, but secondary and tertiary vinyl ethers provide better incorporation of the alcohol. tertiary-butyl vinyl ether is preferred.

Alternatively, the monomer unit can be generated by polymerization of the monomer wherein the acetal moiety has already been generated. Either reaction of hydroxystyrene monomer with a vinyl ether of structure IV or reaction of a vinyl ether and the alcohol of structure V may be used.

The acetal-containing polymer is preferably formed by reacting a polymer containing hydroxystyrene units with t-butyl vinyl ether and an alcohol in the presence of an acid catalyst.

The HO—A—$R^3$ alcohol is preferably selected from the group consisting of: 2,2,3,3-tetrafluoropropanol, 3,3,4,4,5,5,6,6,7,7,8,8,8-tridecafluorooctanol, perfluorocyclohexylmethanol, perfluorobenzyl alcohol, trimethylsilyl methanol, trimethylsilyl ethanol, tris(trimethylsilyl) methanol, tris(trimethylsilyl) ethanol, tris(trimethylsiloxy) methanol, tris(trimethylsiloxy) ethanol, methylbis(trimethylsilyl) ethanol, methyl bis(trimethylsiloxy) ethanol, tris(trimethylsiloxy) propanol, methylbis(trimethylsiloxy) propanol, hydroxymethyl terminated polysiloxane polymers, hydroxyethyl terminated polysiloxane polymers and cyclic siloxane oligomers, such as that of the structure VI shown below, and caged siloxanes, such as the silsesquioxane alkanol compound VII shown below:

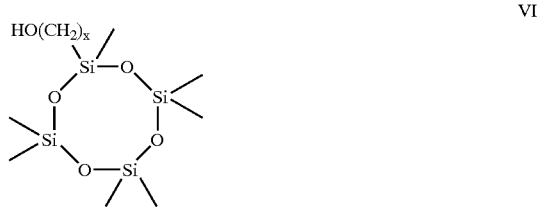

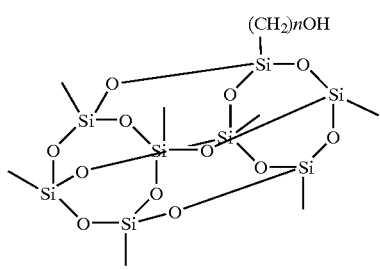

VII where x=1-4 and n=1-4.

Typical examples of monomer II and monomer III structures are 4-hexafluoroisopropanol styrene and 5-[2-trifluoromethyl-1,1,1-trifluoro-2-hydroxy propyl]-2-norbornene, respectively. $R^7$ is H or an acid sensitive group such as t-butoxycarbonyloxy or methyl-t-butoxycarbonyloxy. $R^7$ is preferably an acetal group of the type:

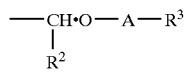

where A, $R^2$ and $R^3$ are as defined as before.

Optionally, the polymer also comprises an additional monomer unit selected from the group consisting of: hydroxystyrene, hydroxystyrene units blocked with other acid sensitive groups, alpha-trifluoromethacrylates, (meth)acrylates, (meth)acrylonitrile, vinyl ethers or acetates, or substituted and unsubstituted maleimides.

Preferably the polymer comprises between about 50-99 molar % of the fluorine-containing monomer and between about 1-50 molar % of the additional acetal-monomer unit.

Where polymer contains silicon functional groups, it comprises between about 5 to 75 molar % of the silicon-containing monomer unit(s) and between about 25 to 95 molar % of other monomer units. More preferably the silicon-containing monomer unit(s) is present in an amount between about 5 to 30 molar % and other monomer units are present in amounts between about 70 to 95 molar %.

The fluorine-containing polymer typically has a molecular weight in the range between about 2,000 to 75,000.

The polymer backbones of this invention can be prepared from the corresponding vinyl monomers by any suitable conventional polymerization process. Such processes include, but are not limited to, free radical or controlled radical polymerizations. Such processes typically are run in a solvent or solvent mixture using a catalyst or initiator. The temperature employed may depend on the monomer stability, and the catalytic ability of the catalyst at the operating temperature or by the decomposition half life of the initiator. Examples of suitable free radical initiators include, but are not limited to, benzoyl peroxide, 2,2'-azobisisobutyronitrile, 2,2'-azobis(methylisobutyronitrile), dimethyl 2,2'-azobisisobutyrate and lauroyl peroxide. Optionally, a chain transfer agent (e.g. carbon tetrabromide or 1-dodecanethiol) may be included. Suitable solvents for polymerization include, but are not limited to, dioxane, tetrahydrofuran, 2-methyltetrahydrofuran, acetonitrile, toluene, ethylacetate, propylene glycol monomethyl ether acetate, tetrahydropyran, methyl ethyl ketone, methyl isobutyl ketone, and diglyme or any combination thereof.

The present invention also includes a photoresist composition comprising the novel polymer comprising at least one fluorine-containing monomer of Structure II or III or and at least one acetal-containing monomer of Structure I, at least one photoacid generator compound and at least one solvent.

Photosensitive compositions can be formulated using the polymers of the present invention. The polymer(s) of the present invention comprise from about 0.9% to about 25% by weight of the photosensitive composition. The photosensitive compositions will comprise the polymers of this invention and a photoacid generator. The polymers of this invention may be blended with another photoresist polymer, which may contain silicon. Generally, any photoresist polymer with alkali solubilizing groups protected by acid sensitive groups may be blended in these photosensitive compositions. Suitable additional silicon-containing polymers for blending include acrylic polymers, such as those described in U.S. Patent. Nos. U.S. Pat. No. 6,146,793 and U.S. Pat. No. 6,165,682, herein incorporated by reference. Suitable non-silicon-containing polymers for blending include acetal protected hydroxystyrene polymers, such as those described in U.S. Pat. Nos. 5,468,589, 5,976,759, 5,849,808, and 6,159,653, herein incorporated by reference and acrylic polymers, such as described in U.S. Pat. Nos. 4,491,628, 6,284,430, and 6,042,997, herein incorporated by reference.

Any suitable photoacid generator compound may be used in the photoresist composition. Preferred photoacid generators are those generating sulfonic acids. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589, which are incorporated herein by reference. Other suitable photoacid generators are perfluoroalkyl sulfonyl methides and perfluoroalkyl sulfonyl imides as disclosed in U.S. Pat. No. 5,554,664, incorporated herein by reference thereto.

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiophenium chloride, and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenylsulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl) sulfonium perfluorooctanesulfonate, tris(t-butylphenyl) sulfonium perfluorobutanesulfonate, tris(t-butylphenyl) sulfonium 2,4,6-triisopropylbenzenesulfonate, tris(t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis(t-butylphenyl)iodonium perfluorobutanesulfonate, bis(t-butylphenyl)iodonium perfluorooctanesulfonate, diphenyl iodonium perfluorooctanesulfonate, bis(t-butylphenyl)iodonium benzenesulfonate, bis(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl) diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzene-sulfonate.

The photoacid generator compound is typically employed in the amounts of about 0.1 to 20% by weight of polymer solids and more preferably about 1% to 15% by weight of polymer solids. Preferred photoacid generators are sulfonium salts. The photoacid generator may be used alone or in combination with one or more photoacid generators. The percentage of each photoacid generator in photoacid generator mixtures is between about 10% to about 90% of the total photoacid generator mixture. Preferred photoacid generator mixtures contain about 2 or 3 photoacid generators. Such mixtures may be of the same class or different classes. Examples of preferred mixtures include sulfonium salts with bissulfonyldiazomethane compounds, sulfonium salts and imidosulfonates, and two sulfonium salts.

The choice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be removable on drying after coating. The solvent is generally present in the composition in an amount of from about 75 to about 99% by weight. Suitable solvents for the photoresist composition may include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyethanol, 2-ethoxyethyl acetate, I-methoxy-2-propyl acetate, 1,2-dimethoxy ethane ethyl acetate, cellosolve acetate, propylene glycol monoethyl ether acetate (PGMEA), methyl lactate, ethyl lactate, n-butyl acetate, methyl pyruvate, ethyl pyruvate, methyl 3-methoxypropionate, ethyl 3-methoxypropionate, 1,4-dioxane, ethylene glycol monoisopropyl ether, diethylene glycol monoethyl ether, diethylene glycol monomethyl ether, diethylene glycol dimethyl ether, and the like or mixtures thereof.

In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids, thereby increasing the performance and stability of the resist. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to 50% by weight of the photoacid generator compound. Suitable examples of base additives are 2-methylimidazole, triisopropylamine, 4-dimethylaminopyridine, 4,4'-diaminodiphenyl ether, 2,4,5-triphenylimidazole, and 1,5-diazobicyclo[4.3.0]non-5-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812, which is incorporated herein by reference.

The photoresist composition may further comprise conventional additives, such as adhesion promoters and surfactants. A person skilled in the art will be able to choose the appropriate desired additive and its concentration.

The present invention also includes a bilayer resist comprising: a photoresist composition comprising at least one fluorine-containing monomer unit of Structures II or III and at least one acetal-containing monomer unit of Structure I wherein at least one of I, II, and III has a silicon substituent; provided that the silicon substituent is not directly attached to the acetal functionality, at least one photoacid generator compound, and at least one solvent; and an undercoat layer.

The photoresist composition is applied uniformly to a substrate by known coating methods. For example, the coatings may be applied by spin-coating, dipping, knife coating, lamination, brushing, spraying, and reverse-roll coating. The coating thickness range generally covers values of about 0.1 to more than 10 $\mu$m. After the coating operation, the solvent is generally removed by drying. The drying step is typically a heating step called 'soft bake' where the resist and substrate are heated to a temperature of about 50° C. to 150° C. for about a few seconds to a few minutes; preferably for about 5 seconds to 30 minutes depending on the thickness, the heating element and end use of the resist.

The photoresist compositions are suitable for a number of different uses in the electronics industry. For example, it can be used as electroplating resist, plasma etch resist, solder resist, resist for the production of printing plates, resist for chemical milling or resist in the production of integrated circuits. The possible coatings and processing conditions of the coated substrates differ accordingly.

For the production of relief structures, the substrate coated with the photoresist composition is exposed imagewise. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources, which can be used, are all sources that emit radiation to which the photoacid generator is sensitive. Examples include high pressure mercury lamp, KrF excimer lasers, ArF excimer lasers, $F_2$ excimer lasers, electron beams and x-rays sources.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 300 seconds.

After imagewise exposure and any heat treatment of the material, the exposed areas of the photoresist are removed by dissolution in a developer. The choice of the particular developer depends on the type of photoresist; in particular on the nature of the polymer resin or the photolysis products generated. The developer can include aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

After the development step, the substrate carrying the resist coating is generally subjected to at least one further treatment step which changes substrate in areas not covered by the photoresist coating. Typically, this can be implantation of a dopant, deposition of another material on the substrate or an etching of the substrate. This is usually followed by the removal of the resist coating from the substrate using a suitable stripping method.

The resist of this invention may be coated over an undercoat to form a bilayer resist. Films of undercoats are typically spun cast from solvents suitable for photoresist applications and baked similar to photoresists. Film thickness of the undercoat will vary depending on the exact application but generally range from about 800 Angstroms to about 10,000 angstroms. Thicknesses of from about 1500 Angstroms to about 5000 Angstroms are preferred.

Suitable undercoats have several required characteristics. First, there should be no intermixing between the undercoat and resist. Generally this is achieved by casting a film of undercoat and crosslinking it to reduce casting solvent solubility. The crosslinking may be thermally or photochemically induced. Examples of this photochemical and thermal crosslinking may be found in U.S. Pat. Nos. 6,146,793, 6,054,248, 6,323,287 and 6,165,682 and U.S. application Ser. No. 10/093,079, filed on Mar. 7, 2002, based upon U.S. Provisional Patent Application No. 60/275,528 hereby incorporated by reference. Undercoats also generally are designed to have good substrate plasma etch resistance. Generally, the optical (n,k) parameters of a suitable undercoat are optimized for the exposure wavelength to minimize reflections.

Imaging the photosensitive composition of this invention on the overcoat is substantially the same as on a substrate. After images are formed in the radiation sensitive resist, the substrate will be placed in a plasma-etching environment comprising oxygen so that the undercoat will be removed in the area unprotected by the resist. The silicon in the silicon-containing monomer unit forms silicon dioxide when exposed to an oxygen plasma and protects the resist from being etched so that relief structures can be formed in the undercoat layer.

After the oxygen plasma step, the substrate carrying the bilayer relief structure is generally subjected to at least on further treatment step which changes the substrate in areas not covered by the bilayer coating. Typically, this can be implantation of a dopant, deposition of another material on the substrate or an etching of the substrate. This is usually followed by the removal of the resist and its byproducts and the undercoat.

The invention is illustrated by, but not limited to, the following examples.

SYNTHESIS PROCEDURE FOR FLUORINE-CONTAINING POLYMERS

SYNTHESIS EXAMPLE 1

Preparation of 4-[2-(1,1,1,3,3,3-hexafluoro-2-hydroxy)-propyl]styrene-co-4-hydroxystyrene copolymer (SE-1)

Into a 100-mL three-necked round bottom flask the following ingredients were charged: 18.6 g of 4-hexafluoroisopropylstyrene (HFIPSty), 8.31 g of 4-acetoxystyrene (AS), 25.15 g of tetrahydrofuran (THF) and 0.30 g of 1-dodecanethiol. The flask was equipped with a magnetic stir bar, a thermocouple, a refluxing condenser and a glass stopper. The solution was stirred and heated to 55° C. then 0.98 g of 2,2'-azobis(2-methylbutyronitrile) was added to initiate the polymerization. The solution was heated to 65° C. for 24 h. The polymer solution was cooled to room temperature and 60 g of methanol and 0.244 g p-toluene sulfonic acid (pTSA) were added. The mixture was refluxed at 64° C. for 4 h. A Dean Stark condenser was inserted between the flask and the reflux condenser and the mixture was heated for two more hours with constant drainage of distillate and addition of fresh methanol to the mixture (~25 mL of distillate/methanol each time). Reaction completion was determined by the absence of a carbonyl stretch in the IR spectrum. After the mixture cooled to room temperature, 5.58 g of CR-20 ion-exchange resin (a product of Mitsubishi Chemical) was added and stirred for 1 h. The solution was filtered and precipitated in 1.4 L of water/methanol (70:30). The wet solid was filtered and washed with 500 mL of water. The polymer was dried in a vacuum oven at 65° C. under vacuum for 24 h. The dry polymer weighed 16.35 g (82% recovery). Analytical data is included in the table below.

SYNTHESIS EXAMPLE 2

Preparation of Acetal Blocked SE-1 (SE-2): Prepared by Reaction Between SE-1 and t-butyl vinyl ether and 3,3,4,4,5,5,6,6,7,7,8,8,8-tridecafluoro-1-octanol Into a 100-mL three-neck round-bottom flask equipped with a magnetic stir bar, a thermocouple, a glass stopper and a rubber septum was charged 4.98 g of poly(4-hexafluoroisopropylstyrene-co-4-hydroxystyrene) (SE-1) and 29.27 g of ethyl acetate (EtOAc). The solution was vacuum distilled at 60° C. until 8.40 g of solvent was removed. To 25.85 g of the remaining polymer solution 2.20 g 3,3,4,4,5,5,6,6,7,7,8,8,8-tridecafluoro-1-octanol (FOH) and 0.71 g tertiary butyl vinyl ether (tBVE) were added. The reaction was catalyzed with 0.30 g pTSA solution (prepared as 0.003 g of pTSA dissolved in 0.297 g of EtOAc). At 4 h the reaction was quenched with 1.45 g of CR-20 resin and stirred for 20 minutes. The polymer solution was filtered and precipitated in 300 mL of hexanes and washed three times each with 50 mL of hexanes. The polymer solid was filtered and dried in a vacuum oven at 60° C. for 12 h. Analytical data is included in the table below.

SYNTHESIS EXAMPLE 3
Preparation of Acetal Blocked SE-1 (SE-3): Prepared by Reaction Between SE-1 and t-butyl vinyl ether and 2,2,3,3-tetrafluoro-1-propanol Into a 100-mL round-bottom flask was charged 5.0 g of poly(4-hexafluoroisopropyl styrene-co-4-hydroxystyrene) (SE-1) and 20.0 g of EtOAc. The solution was concentrated using a rotary evaporator at 40° C. until 7.9 g of solvent was removed. The flask was equipped with a magnetic stir bar and a thermocouple. To 17.1 g of the remaining polymer solution 1.6 g of 2,2,3,3-tetrafluoropropanol (TFP) and 1.2 g of tBVE were added. The reaction was catalyzed with 0.03 g of pTSA solution (prepared as 0.0003 g pTSA dissolved in 0.0297 g EtOAc) and stirred for 24 h. The reaction was quenched with 1.0 g of CR-20 resin and stirred for 20 minutes. The polymer solution was filtered and precipitated in 100 mL of hexanes. The polymer solid was filtered and dried in a vacuum oven at 60° C. for 12 h. Analytical data is included in the table below.

SYNTHESIS EXAMPLE 4
Preparation of Acetal Blocked SE-1(SE-4): Prepared by Reaction Between SE-1 and t-butyl vinyl ether and 3-heptamethylcyclotetrasiloxane-1-propanol Into a 50-mL round-bottom flask was charged 1.0 g of poly(4-hexafluoroisopropyl styrene-co-4-hydroxystyrene) (SE-1), 9.38 g of EtOAc and 0.39 g of 3-heptamethylcyclotetrasiloxane-1-propanol (HMTP). The solution was rotovapped at 30° C. until 8.15 g of solvent was removed. This process was repeated with 6.80 g of additional EtOAc added and 5.84 g solvent removed. The flask was equipped with a magnetic stir bar and a thermocouple. To 3.58 g of the remaining polymer solution 2.42 g of EtOAc and 0.13 g of tBVE were added. The reaction was catalyzed with 0.01 g of camphorsulfonic acid (CSA) solution (prepared as 0.0001 g CSA dissolved in 0.0099 g EtOAc). At 4.5 h the reaction was quenched with 0.50 g of triethylamine (TEA) solution (prepared as 0.005 g TEA dissolved in 0.495 g EtOAc) and stirred for 15 minutes. The polymer solution was filtered and precipitated in 300 mL of pentane. The polymer solid was filtered and dried in a vacuum oven at 50° C. for 12 h. Analytical data is included in the table below.

SYNTHESIS EXAMPLE 5
Preparation of 4-[2-(1,1,1,3,3,3-hexafluoro-2-hydroxy)-propyl]styrene-co-4-hydroxystyrene copolymer (SE-5)

Into a 250-mL three-necked round bottom flask the following ingredients were charged: 20.17 g of HFIPSty, 7.74 g of AS, 34.75 g of THF and 0.37 g of 1-dodecanethiol. The flask was equipped with a magnetic stir bar, a thermocouple, a refluxing condenser and a glass stopper. The solution was stirred and heated to 55° C. then 1.23 g of 2,2'-azobis(2-methylbutyronitrile) was added to initiate the polymerization. The solution was heated to 65° C. for 24 h. The polymer solution was cooled to 50° C. and 67.1 g of methanol and 0.3153 g pTSA were added. A Dean Stark condenser was inserted between the flask and the reflux condenser. The mixture was refluxed at 64° C. for 4 h. An IR spectrum of the mixture showed a carbonyl stretch so refluxed one more hour with constant drainage of distillate and addition of fresh methanol to the mixture (~25 mL of distillate/methanol each time). A second IR spectrum of the mixture showed no carbonyl stretch, which indicated that the reaction was complete. After the mixture cooled to room temperature, 3.4 g of CR-20 resin was added and stirred for 1 h. The solution was filtered and precipitated in 0.7 L of water. The wet solid was filtered and dried in a vacuum oven at 65° C. under vacuum for 4 h. The polymer was dissolved in THF to make 100 mL solution and precipitated in 1.2 L of hexanes. The solid was filtered and dried in a vacuum oven at 60° C. under vacuum for 12 h. Analytical data is included in the table below.

SYNTHESIS EXAMPLE 6
Preparation of Acetal Blocked SE-5 (SE-6): Prepared by Reaction Between SE-5 and t-butyl vinyl ether and 3-heptamethylcyclotetrasiloxane-1-propanol Into a 100-mL three-neck round-bottom flask equipped with a magnetic stir bar, a thermocouple, a glass stopper and a rubber septum was charged 9.90 g of poly(4-hexafluoroisopropylstyrene-co-4-hydroxystyrene) (SE-5) and 70.17 g of ethyl acetate (EtOAc). The solution was vacuum distilled at 60° C. until 54.30 g of solvent was removed. The remaining polymer solution (25.77 g) was diluted with 23.74 g of EtOAc, then 4.77 g of HMTP and 1.83 g of tBVE were added. The reaction was catalyzed with 0.60 g of pTSA solution (prepared as 0.006 g pTSA dissolved in 0.594 g EtOAc). At 4 h the reaction was quenched with 1.0 g of TEA solution (prepared as 0.01 g TEA dissolved in 0.99 g EtOAc) and stirred for 15 minutes. The polymer solution was filtered and precipitated in 300 mL of hexanes. The polymer solid was filtered and dried in a vacuum oven at 60° C. for 12 h. In a 100-mL round-bottom flask equipped with a magnetic stir bar and a thermocouple, 9.12 g of the dried polymer was dissolved in 35.88 g of EtOAc to which 1.67 g of tBVE and 3.67 g of HMTP were added. Then 0.50 g of PTSA solution (prepared as 0.005 g pTSA dissolved in 0.495 g EtOAc) was added. The reaction was quenched at 4 h with 1.0 g of TEA solution (prepared as 0.01 g TEA dissolved in 0.99 g EtOAc). The polymer solution was precipitated in 1 L of hexanes, filtered and vacuum dried at 60° C. for 12 h. The dry polymer weighed 3.3 g. Analytical data is included in the table below.

SYNTHESIS EXAMPLE 7
Preparation of Acetal and t-Boc-Blocked SE-5 (SE-7): Prepared by Reaction Between polymer of SE-6 and di-tertiary butyl dicarbonate.

Into a 100-mL bottle was charged 2.99 g of Polymer SE-6, 15.24 g of THF, 0.37 g of di-tertiary-butyl dicarbonate and 0.16 g of 4-dimethylaminopyridine (DMAP) solution (prepared as 0.06 g of DMAP in 9.60 g of PGMEA). The bottle was rolled 12 h. The polymer solution was precipitated in 1 L of water. The polymer solid was filtered and dried in a vacuum oven at 60° C. for 12 h. The dry polymer weighed 2.7 g. Analytical data is included in the table below.

| Polymer | Backbone | Alcohol/ Carbonate Type | % Blocking alcohol acetal or carbonate | % Total Blocking[a] | Mw | Abs/ μm |
|---|---|---|---|---|---|---|
| — | Poly(4-hydroxystyrene) (PHS) | — | — | — | 8000 | 7.13 |
| SE-1 | Poly(4-hexafluoroisopropyl styrene co-4-hydroxystyrene) (HFIPSty/HS, 59:41[b]) | — | — | — | 19500 | 4.59 |
| SE-2 | SE-1 | FOH | 4 | 7 | 20000 | 4.57 |
| SE-3 | SE-1 | TFP | [c] | 11 | 21000 | 4.64 |
| SE-4 | SE-1 | HMTP | 8 | 28 | 27000 | 4.30 |
| SE-5 | HFIPSty/HS (66:34) | — | — | — | 16000 | 4.49 |
| SE-6 | SE-5 | HMTP | 10 | 30 | 26000 | 4.04 |
| SE-7 | SE-6 | Di-tertiarybutyl-dicarbonate | 9 | 39[d] | 28500 | 3.94 |

[a]Total blocking is calculated as the combined molar ratio of t-butyl acetal and acetal from alcohol
[b]Polymer composition determined by $^1$H NMR
[c]Individual blocking due to TFP acetal cannot be determined because of peak overlapping.
[d]Total blocking is calculated as the combined molar ratio of t-butyl acetal and acetal from alcohol from SE-6 and t-butoxycarbonyloxy

LITHOGRAPHIC EXAMPLE 1

A formulation consisting of the polymer of Synthesis Example 7 (1.17 g), triphenylsulfonium acetate (0.0125 g), toluyl-diphenylsulfonium-perfluorobutyl sulfonate (0.0504 g), triphenylsulfonium-perfluoro undecyl carboxylate (0.0126 g), n-butyl acetate (11.875 g) and PGMEA (11.875 g) was mixed in an amber-bottle and rolled until a homogeneous solution was obtained. The solution was filtered through 0.1 μm filter into a clean amber-bottle. Photoresist films of 1000 Å thickness were prepared by spin coating on top a DUV-30 cured wafer (800 Å thickness; an antireflective coat obtained from Brewer Science) and pre-exposure baking at 110° C. for 90 seconds. Films were exposed using an Ultratech stepper using a 157 nm laser. A phase shift mask with 6%-transmission was used to expose line-space patterns. The optical settings used were 0.65 numerical aperture (NA) and 0.3 sigma. The film was then post-exposure baked at 110° C. for 90 seconds and developed in a puddle of 0.26-N tetramethyl ammonium hydroxide for about 60 seconds, rinsed with de-ionized water and spun-dried.

The line-space patterns formed into the resist film were analyzed using KLA CD-SEM.

TABLE 2

| Energy to size 0.13 μm | Minimum resolution |
|---|---|
| 55.5 mJ/cm2 | 0.09 μm |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall within the spirit and scope of the appended claims.

We claim:

1. A polymer comprising an acetal-containing monomer unit having the general structure I and at least one of the fluorine-containing monomer units-having the general structures II and III:

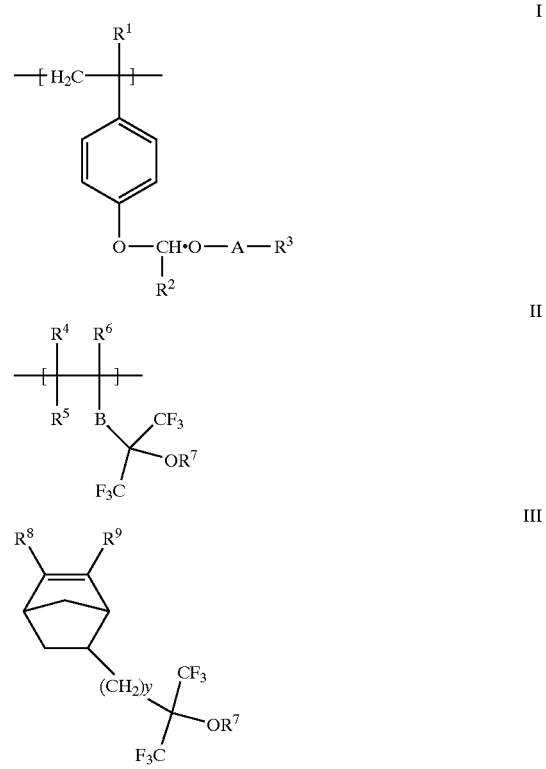

wherein $R^1$, $R^4$, $R^5$ and $R^6$ are each independently selected from the group consisting of H, lower alkyl $CH_2CO_2R^{10}$, cyano, $CH_2CN$, and halogen, wherein $R^{10}$ is selected from the group consisting of any alkyl cycloalkyl, aryl, arylalkyl, alkylenecycloalkyl, silyl or siloxy or linear or cyclic polysiloxane group; $R^2$ is $CHR^{11}R^{12}$ where $R^{11}$ and $R^{12}$ are each independently selected from the group consisting of H, lower alkyl, cycloalkyl and aryl; A is selected from the group consisting of a substituted or unsubstituted alkylene, cycloalkylene, alkylenecycloalkylene and alkylenearylene; and $R^3$ is selected from the group consisting of a linear, branched or cyclic fluoroalkyl group and $SiR^{13}R^{14}R^{15}$ where $R^{13}$, $R^{14}$, and $R^{15}$ are each independently selected from the group consisting of alkyl, cycloalkyl, aryl, arylalkyl, alkylenecycloalkyl, silyl, siloxy, linear or cyclic polysiloxane or silsesquioxane alkyl group; B is selected from the group consisting of an aryl, C(=O)—O—$(CH_2)_x$ where x=0–4, lower alkyl, cycloalkyl, alkene cycloalkyl, silyl, siloxyl, or linear or cyclic polysiloxane group. $R^7$ is selected from the group consisting of H or an acid sensitive group; $R^8$ and $R^9$ are each independently selected from the group consisting of H or —CN group; and y=0–4.

2. A polymer of claim 1 wherein A is selected from the group consisting of: methylene, ethylene, $CH_2C(CH_3)H$, propylene, $CH(CH_3)CH(CH_3)CH(CH_3)$, cyclohexylene, ethylenecyclohexylene, phenyleneethylene; and $R^3$ is selected from the group consisting of: tetrafluoroethyl, tridecafluorohexyl, perfluorocyclohexyl, perfluorophenyl, perfluoroethyl, perfluorobutyl, perfluorooctyl, trimethyl silyl, triethyl silyl, triphenyl silyl, tricyclohexylsilyl, tris(trimethylsiloxy)silyl, tris(trimethylsilyl)silyl, methylbis(trimethylsilyl)silyl, methylbis(trimethylsiloxy)silyl, dimethyl(trimethylsilyl )silyl, dimethyl(trimethylsiloxy) silyl, cyclic or linear siloxane oligomer or polymer or silsesquioxane alkyl group.

3. A polymer of claim 1 wherein the polymer comprises from about 50 to about 99 molar % of the fluorine-containing momomer unit II or III and from about 1 to about 50 molar % of the acetal momomeric unit I.

4. A polymer of claim 1 wherein the polymer comprises from about 5 to about 75 molar % of silicon-containing monomer unit(s) and from about 25 to about 95 molar % of other monomer units.

5. A polymer of claim 1 wherein the polymer comprises from about 5 to about 30 molar % of silicon-containing monomer unit(s) and from about 70 to about 95 molar % of other monomer units.

6. A polymer of claim 1 having a molecular weight (Mw) of from about 2,000 to about 75,000.

7. A polymer of claim 1 comprising an additional monomeric unit selected from the group of monomeric units consisting of hydroxystyrene, hydroxystyrene units blocked with other acid sensitive groups, alpha-trifluoromethacrylate, (meth)acrylate, (meth)acrylonitrile, vinyl ether or acetate, or substituted and unsubstituted maleimide units.

8. A radiation sensitive composition comprising:

a) a polymer comprises an acetal-containing monomer unit having the general structure I and at least one of the fluorine-containing monomer units having the general structures II and III:

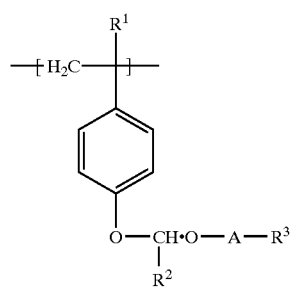

I

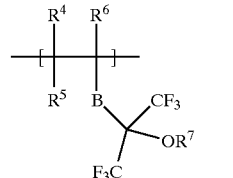

II

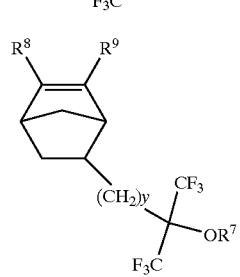

III wherein $R^1$, $R^4$, $R^5$ and $R^6$ are each independently selected from the group consisting of H, lower alkyl, $CH_2CO_2R^{10}$, cyano, $CH_2CN$, and halogen, wherein $R^{10}$ is selected from the group consisting of any alkyl, cycloalkyl, aryl, arylalkyl, alkylenecycloalkyl, silyl or siloxy or linear or cyclic polysiloxane group; $R^2$ is $CHR^{11}R^{12}$ where $R^{11}$ and $R^{12}$ are each independently selected from the group consisting of H, lower alkyl, cycloalkyl and aryl; A is selected from the group consisting of a substituted or unsubstituted alkylene, cycloalkylene, alkylenecycloalkylene and alkylenearylene; and $R^3$ is selected from the group consisting of a linear, branched or cyclic fluoroalkyl group and $SiR^{13}R^{14}R^{15}$ where $R^{13}$, $R^{14}$, and $R^{15}$ are each independently selected from the group consisting of alkyl, cycloalkyl, aryl, arylalkyl, alkylenecycloalkyl, silyl, siloxy, linear or cyclic polysiloxane or silsesquioxane alkyl group; B is selected from the group consisting of an aryl, C(=O)—O—$(CH_2)_x$ where x=0–4, lower alkyl, cycloalkyl, alkene cycloalkyl, silyl, siloxyl, or linear or cyclic polysiloxane group. $R^7$ is selected from the group consisting of H or an acid sensitive group; $R^8$ and $R^9$ are each independently selected from the group consisting of H or —CN group; and y=0–4;

b) aleast one photoacid generator compound; and c) at least one solvent.

9. A radiation sensitive composition of claim 8 wherein A is selected from the group consisting of: methylene, ethylene, $CH_2C(CH_3)H$, propylene, $CH(CH_3)CH(CH_3)CH(CH_3)$, cyclohexylene, ethylenecyclohexylene, phenyleneethylene; and $R^3$ is selected from the group consisting of: tetrafluoroethyl, tridecafluorohexyl, perfluorocyclohexyl, perfluorophenyl, perfluoroethyl, perfluorobutyl, perfluorooctyl, trimethyl silyl, triethyl silyl, triphenyl silyl, tricyclohexylsilyl, tris(trimethylsiloxy)silyl, tris(trimethylsilyl)silyl, methylbis(trimethylsilyl)silyl, methylbis(trimethylsiloxy)silyl, dimethyl(trimethylsilyl) silyl, dimethyl(trimethylsiloxy)silyl, cyclic or linear siloxane oligomer or polymer or silsesquioxane alkyl group.

10. A radiation sensitive composition of claim 8 wherein the polymer comprises from about 50 to about 99 molar % of the fluorine-containing momomer unit II or III and from about 1 to about 50 molar % of the acetal momomeric unit I.

11. A radiation sensitive composition of claim 8 wherein the polymer comprises from about 5 to about 75 molar % of silicon-containing monomer unit(s) and from about 25 to about 95 molar % of other monomer units.

12. A radiation sensitive composition of claim 8 wherein the polymer comprises from about 5 to about 30 molar % of silicon-containing monomer unit(s) and from about 70 to about 95 molar % of other monomer units.

13. A radiation sensitive composition of claim 8 wherein the polymer has a molecular weight (Mw) of from about 2,000 to about 75,000.

14. A radiation sensitive composition of claim 8 wherein the polymer comprises an additional monomeric unit selected from the group of monomeric units consisting of hydroxystyrene, hydroxystyrene units blocked with other acid sensitive groups, alpha-trifluoromethacrylate, (meth)acrylate, (meth)acrylonitrile, vinyl ether or acetate, or substituted and unsubstituted maleimide units.

15. A radiation sensitive coated substrate comprising:
a) a substrate;
b) an undercoat layer coated on the substrate, and
c) a photosensitive topcoat layer overlaying the undercoat layer and comprising a coating of:
a polymer comprising an acetal-containing monomer unit having the general structure I and at least one of the fluorine-containing monomer units having the general structures II and III:

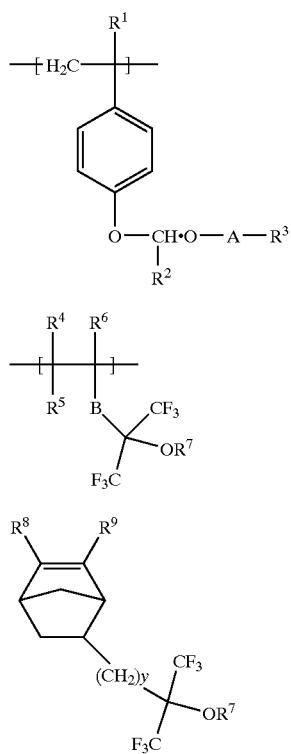

wherein $R^1$, $R^4$, $R^5$ and $R^6$ are each independently selected from the group consisting of H, lower alkyl, $CH_2CO_2R^{10}$, cyano, $CH_2CN$, and halogen, wherein $R^{10}$ is selected from the group consisting of any alkyl, cycloalkyl, aryl, arylalkyl, alkylenecycloalkyl, silyl or siloxy or linear or cyclic polysiloxane group; $R^2$ is $CHR^{11}R^{12}$ where $R^{11}$ and $R^{12}$ are each independently selected from the group consisting of H, lower alkyl, cycloalkyl and aryl; A is selected from the group consisting of a substituted or unsubstituted alkylene, cycloalkylene, alkylenecycloalkylene and alkylenearylene; and $R^3$ is selected from the group consisting of a linear, branched or cyclic fluoroalkyl group and $SiR^{13}R^{14}R^{15}$ where $R^{13}$, $R^{14}$, and $R^{15}$ are each independently selected from the group consisting of alkyl, cycloalkyl, aryl, arylalkyl, alkylenecycloalkyl, silyl, siloxy, linear or cyclic polysiloxane or silsesquioxane alkyl group; B is selected from the group consisting of an aryl, $C(=O)-O-(CH_2)_x$ where x=0–4, lower alkyl, cycloalkyl, alkene cycloalkyl, silyl, siloxyl, or linear or cyclic polysiloxane group. $R^7$ is selected from the group consisting of H or an acid sensitive group; $R^8$ and $R^9$ are each independently selected from the group consisting of H or —CN group; and y=0–4; provided that at least one of the acetal-containing monomeric units I and the fluorine-containing monomer units II or III has a silicon substituent that is not directly attached to an acetal functionality.

16. A radiation sensitive coated substrate of claim 15 wherein A is selected from the group consisting of: methylene, ethylene, $CH_2C(CH_3)H$, propylene, $CH(CH_3)CH(CH_3)CH(CH_3)$, cyclohexylene, ethylenecyclohexylene, phenyleneethylene; and $R^3$ is selected from the group consisting of: tetrafluoroethyl, tridecafluorohexyl, perfluorocyclohexyl, perfluorophenyl, perfluoroethyl, perfluorobutyl, perfluorooctyl, trimethyl silyl, triethyl silyl, triphenyl silyl, tricyclohexylsilyl, tris(trimethylsiloxy)silyl, tris(trimethylsilyl)silyl, methylbis(trimethylsilyl)silyl, methylbis(trimethylsiloxy)silyl, dimethyl(trimethylsilyl)silyl, dimethyl(trimethylsiloxy)silyl, cyclic or linear siloxane oligomer or polymer or silsesquioxane alkyl group.

17. A radiation sensitive coated substrate of claim 15 wherein the polymer comprises from about 50 to about 99 molar % of the fluorine-containing momomer unit II or III and from about 1 to about 50 molar % of the acetal momomeric unit I.

18. A radiation sensitive coated substrate of claim 15 wherein the polymer comprises from about 5 to about 75 molar % of silicon-containing monomer unit(s) and from about 25 to about 95 molar % of other monomer units.

19. A radiation sensitive coated substrate of claim 15 wherein the polymer comprises from about 5 to about 30 molar % of silicon-containing monomer unit(s) and from about 70 to about 95 molar % of other monomer units.

20. A radiation sensitive coated substrate of claim 15 wherein the polymer has a molecular weight (Mw) of from about 2,000 to about 75, 000.

21. A radiation sensitive coated substrate of claim 15 wherein the polymer comprises an additional monomeric unit selected from the group of monomeric units consisting of hydroxystyrene, hydroxystyrene units blocked with other acid sensitive groups, alpha-trifluoromethacrylate, (meth)acrylate, (meth)acrylonitrile, vinyl ether or acetate, or substituted and unsubstituted maleimide units.

22. A process for producing a patterned image on a substrate, the process comprising the steps of:
(a) coating on a suitable substrate, a positive-working photosensitive composition of claim 8, thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate.

23. A process for producing a patterned image on a substrate, the process comprising the steps of:
(a) coating on a suitable substrate, a positive-working photosensitive composition of claim 9, thereby forming a coated substrate;
(b) prebaking the coated substrate;
(c) exposing the prebaked coated substrate to actinic radiation;

(d) developing the exposed coated substrate with an aqueous developer, thereby forming an uncured relief image on the coated substrate.

24. A process for producing a patterned image on a substrate, the process comprising the steps of:
(a) coating on a suitable substrate, a positive-working photosensitive composition of claim 10 thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate.

25. A process for producing a patterned image on a substrate, the process comprising the steps of:
(a) coating on a suitable substrate, a positive-working photosensitive composition of claim 11, thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate.

26. A process for producing a patterned image on a substrate, the process comprising the steps of:
(a) coating on a suitable substrate, a positive-working photosensitive composition of claim 12, thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate.

27. A process for producing a patterned image on a substrate, the process comprising the steps of:
(a) coating on a suitable substrate, a positive-working photosensitive composition of claim 13, thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate.

28. A process for producing a patterned image on a substrate, the process comprising the steps of:
(a) coating on a suitable substrate, a positive-working photosensitive composition of claim 14, thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate.

29. A patterned substrate produced by the process of claim 22.

30. A patterned substrate produced by the process of claim 23.

31. A patterned substrate produced by the process of claim 24.

32. A patterned substrate produced by the process of claim 25.

33. A patterned substrate produced by the process of claim 26.

34. A patterned substrate produced by the process of claim 27.

35. A patterned substrate produced by the process of claim 28.

36. A radiation sensitive silicon-containing resist composition comprising:
(a) a polymer comprising an acetal-containing monomer unit having the general structure I and at least one of the fluorine-containing monomer units having the general structures II and III:

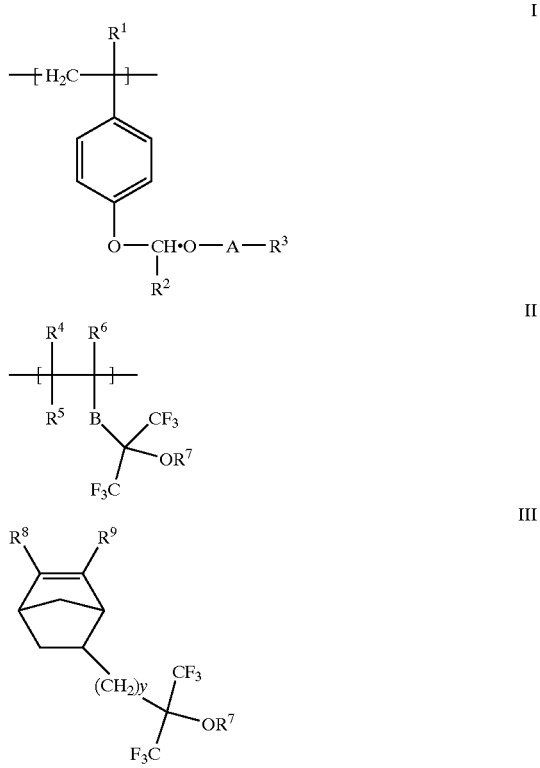

wherein $R^1$, $R^4$, $R^5$ and $R^6$ are each independently selected from the group consisting of H, lower alkyl, $CH_2CO_2R^{10}$, cyano, $CH_2CN$, and halogen, wherein $R^{10}$ is selected from the group consisting of any alkyl, cycloalkyl, aryl, arylalkyl, alkylenecycloalkyl, silyl or siloxy or linear or cyclic polysiloxane group; $R^2$ is $CHR^{11}R^{12}$ where $R^{11}$ and $R^{12}$ are each independently selected from the group consisting of H, lower alkyl, cycloalkyl and aryl; A is selected from the group consisting of a substituted or unsubstituted alkylene, cycloalkylene, alkylenecycloalkylene and alkylenearylene; and $R^3$ is selected from the group consisting of a linear, branched or cyclic fluoroalkyl group and $SiR^{13}R^{14}R^{15}$ where $R^{13}$, $R^{14}$, and $R^{15}$ are each independently selected from the group consisting of alkyl, cycloalkyl, aryl, arylalkyl, alkylenecycloalkyl, silyl, siloxy, linear or cyclic polysiloxane or silsesquioxane alkyl group; B is selected from the group consisting of an aryl, $C(=O)—O—(CH_2)_x$ where x=0–4, lower alkyl, cycloalkyl, alkene cycloalkyl, silyl, siloxyl, or linear or cyclic polysiloxane group. $R^7$ is selected from the group consisting of H or an acid sensitive group; $R^8$ and $R^9$ are each independently selected from the group consisting of H or —CN group; and y=0–4; provided that at least one of the acetal-containing monomeric units I and the fluorine-containing monomer units II or III has a silicon substituent that is not directly attached to an acetal functionality;

(b) at least one photoacid generator compound; and (c) at least one solvent.

37. A radiation sensitive silicon-containing resist composition of claim 36 wherein A is selected from the group consisting of: methylene, ethylene, $CH_2C(CH_3)H$, propylene, $CH(CH_3)CH(CH_3)CH(CH_3)$, cyclohexylene, ethylenecyclohexylene, phenyleneethylene; and $R^3$ is selected from the group consisting of: tetrafluoroethyl, tridecafluorohexyl, perfluorocyclohexyl, perfluorophenyl, perfluoroethyl, perfluorobutyl, perfluorooctyl, trimethyl silyl, triethyl silyl, triphenyl silyl, tricyclohexylsilyl, tris(trimethylsiloxy)silyl, tris(trimethylsilyl)silyl, methylbis(trimethylsilyl)silyl, methylbis(trimethylsiloxy)silyl, dimethyl(trimethylsilyl)silyl, dimethyl(trimethylsiloxy)silyl, cyclic or linear siloxane oligomer or polymer or silsesquioxane alkyl group.

38. A radiation sensitive silicon-containing resist composition of claim 36 wherein the polymer comprises from about 50 to about 99 molar % of the fluorine-containing momomer unit II or III and from about 1 to about 50 molar % of the acetal momomeric unit I.

39. A radiation sensitive silicon-containing resist composition of claim 36 wherein the polymer comprises from about 5 to about 75 molar % of silicon-containing monomer unit(s) and from about 25 to about 95 molar % of other monomer units.

40. A radiation sensitive silicon-containing resist composition of claim 36 wherein the polymer comprises from about 5 to about 30 molar % of silicon-containing monomer unit(s) and from about 70 to about 95 molar % of other monomer units.

41. A radiation sensitive silicon-containing resist composition of claim 36 wherein the polymer has a molecular weight (Mw) of from about 2,000 to about 75,000.

42. A radiation sensitive silicon-containing resist composition of claim 36 wherein the polymer comprises an additional monomeric unit selected from the group of monomeric units consisting of hydroxystyrene, hydroxystyrene units blocked with other acid sensitive groups, alpha-trifluoromethacrylate, (meth)acrylate, (meth)acrylonitrile, vinyl ether or acetate, or substituted and unsubstituted maleimide units.

* * * * *